(12) United States Patent
Araumi

(10) Patent No.: US 7,615,481 B2
(45) Date of Patent: Nov. 10, 2009

(54) METHOD OF MANUFACTURING MULTILEVEL INTERCONNECT STRUCTURE AND MULTILEVEL INTERCONNECT STRUCTURE

(75) Inventor: Mayuka Araumi, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/928,703

(22) Filed: Oct. 30, 2007

(65) Prior Publication Data

US 2008/0116579 A1    May 22, 2008

(30) Foreign Application Priority Data

Nov. 17, 2006   (JP)   ............... 2006-311758
May 25, 2007   (JP)   ............... 2007-139678

(51) Int. Cl.
*H01L 23/52*   (2006.01)

(52) U.S. Cl. ............... 438/622; 257/E21.575; 257/E23.141

(58) Field of Classification Search ............... 438/597, 438/618, 622, 623; 257/750, 758, 759, E23.141, 257/E21.575

See application file for complete search history.

(56) References Cited

U.S. PATENT DOCUMENTS 3,622,384 A * 11/1971 Davey et al. ............... 428/201

4,529,835 A * 7/1985 Mizuno ............... 174/257
2007/0054212 A1   3/2007 Akiyama et al.

FOREIGN PATENT DOCUMENTS

| JP | 2006-120873 | 5/2006 |
| JP | 2007-95783 | 4/2007 |

* cited by examiner

*Primary Examiner*—Matthew Smith
*Assistant Examiner*—Michele Fan
(74) *Attorney, Agent, or Firm*—Oblon, Spivak, McClelland, Maier & Neustadt, L.L.P.

(57) ABSTRACT

A method of manufacturing a multilevel interconnect structure using a screen printing method is disclosed. In the multilevel interconnect structure, an interlayer insulating film having a through hole with a conductive bump therein, and a second interconnect line are stacked on a substrate with a first interconnect line formed thereon. The first interconnect line is electrically connected to the second interconnect line via the conductive bump. The method includes a step of forming a first region of the interlayer insulating film on the substrate with the first interconnect line formed thereon, the first region including a part of a peripheral wall of the through hole; a step of forming a second region of the interlayer insulating film on the substrate with the first region formed thereon, the second region including a remaining part of the peripheral wall of the through hole; and a step of forming the conductive bump.

6 Claims, 13 Drawing Sheets

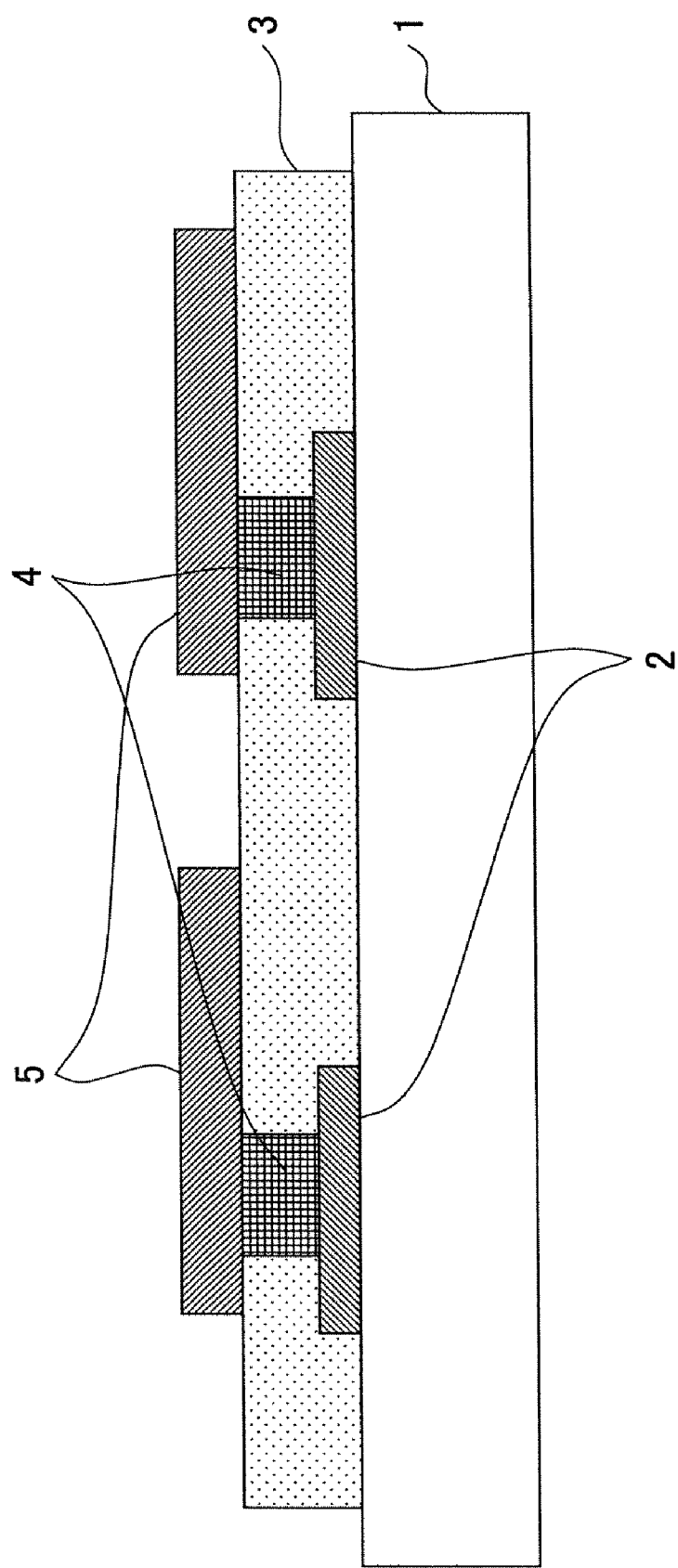

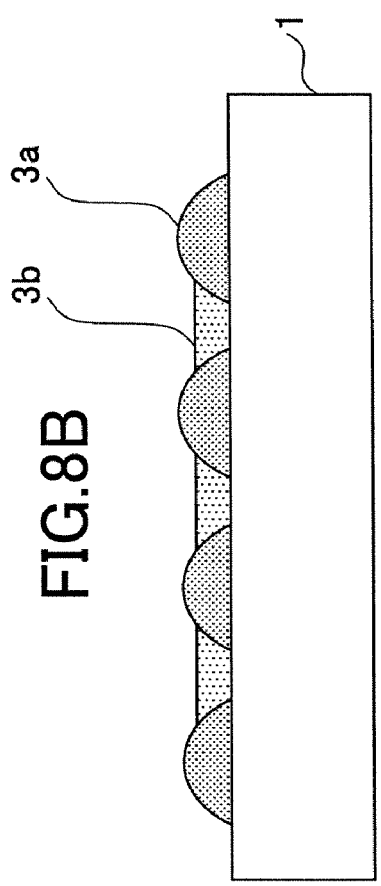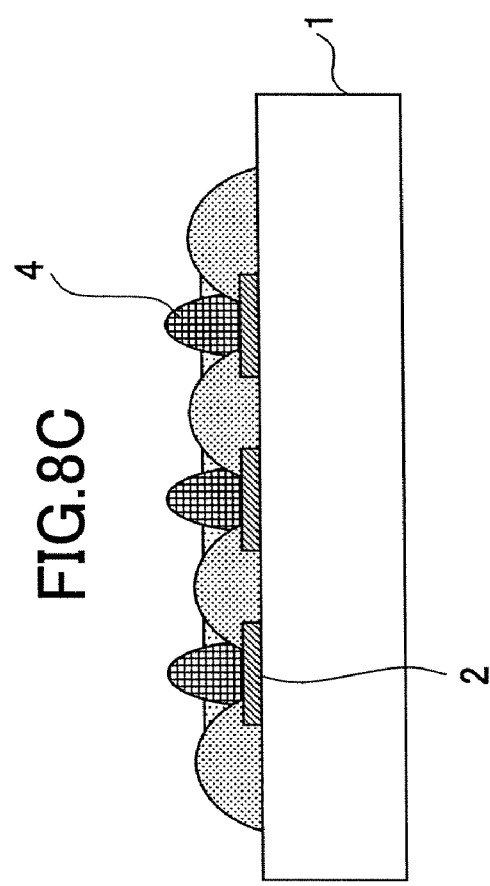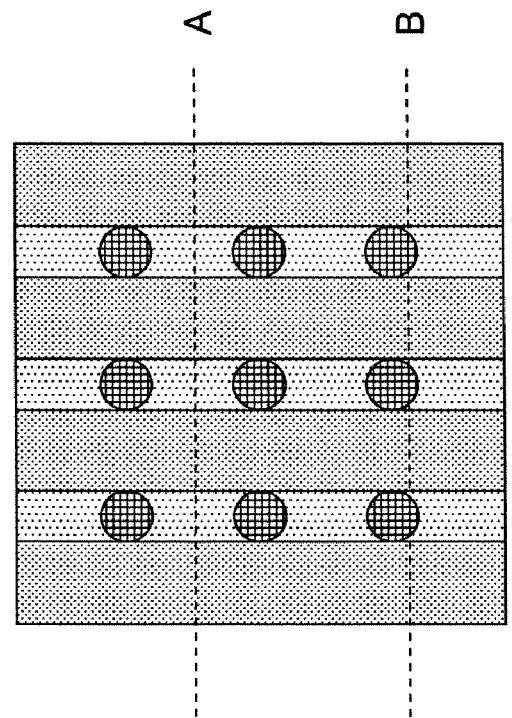

METHOD OF MANUFACTURING MULTILEVEL INTERCONNECT STRUCTURE AND MULTILEVEL INTERCONNECT STRUCTURE

The present application claims priority to, and incorporates by reference, application No. JP 2006-311758 filed Nov. 17, 2006 and application No. JP 2007-139678 filed May 25, 2007.

BACKGROUND OF THE INVENTION

1. Field of the Invention

The present invention relates to a method of manufacturing a multilevel interconnect structure, a multilevel interconnect structure, a transistor device, and an image display.

2. Description of the Related Art

Conventional semiconductor devices having transistors and diodes on their substrates or semiconductor wafers often use multilevel interconnect structures to increase integration density. In the multilevel interconnect structure, an interlayer insulating film is used that has a via hole to provide electrical connection between interconnect lines.

In recent years, insulating materials, such as, e.g., porous silica films, fluorinated silicon oxide films and organic insulating films of silicon and oxygen with methyl group, that have lower relative permittivity than conventional silicon oxide films, have become increasingly popular as the material of the interlayer insulating film. Among these, commonly used are the organic insulating films having low permittivity (of about 2.2-4.0).

However, because a photolithographic technique is used for forming through holes in the organic insulating film, the number of manufacturing steps is increased, and therefor use of the organic insulating film is disadvantageous in terms of cost.

A screen printing method is a printing method that deposits ink onto a mesh (screen printing mask) having an ink non-ejection region, on which an emulsion is disposed to prevent passage of ink, and forces the ink through the mesh by sliding a squeegee. This method is advantageous because it can reduce manufacturing steps and has higher material usage efficiency. The screen printing method is capable of forming fine patterns with simple techniques and therefore has recently been used for forming interconnects in transistors and the like. However, the surface of just-printed ink still having fluidity becomes flat due to gravity, causing a slight blur. This slight blur is highly likely to fill a small through hole. Thus, a through hole of 100 µm square is the smallest size achievable by the conventional printing method. Moreover, the screen printing method is affected by multiple parameters such as a clearance (the distance between a screen mask and a substrate), the angle of the squeegee, pressure, and speed, and it is therefore difficult to stably produce small through holes. In the case of large area printing, the smallest size that has been actually achieved is about 300 µm square.

Japanese Patent Laid-Open Publication No. 2006-120873 discloses a method of manufacturing an impedance-controlled wiring board. According to this method, after a conical conductive bump is formed on a metal foil by screen printing, an insulator is deposited over the conductive bump such that the conductive bump extends through the insulator. Then, a metal foil is deposited over the insulator to be in electric connection with the head of the conductive bump. The problem with this method is that, because the insulator is formed by heating and pressing prepreg, the material of the insulator is limited, and loads due to heat and pressure are imposed on the insulator. The smallest size of the conductive bump achieved in one embodiment is 150 µm, and the possibility of reducing the size of the conductive bump is not mentioned.

SUMMARY OF THE INVENTION

In view of the foregoing, the present invention is directed to provide a method of manufacturing a multilevel interconnect structure capable of electrically interconnecting upper and lower interconnect lines via an interlayer insulating film having a small through hole; a multilevel interconnect structure in which upper and lower interconnect lines are electrically interconnected via an interlayer insulating film having a small through hole; a transistor device including the multilevel interconnect structure; and an image display including the transistor device.

In an embodiment of the present invention, there is provided a method of manufacturing a multilevel interconnect structure using a screen printing method. In the multilevel interconnect structure, an interlayer insulating film having a through hole with a conductive bump therein, and a second interconnect line are stacked on a substrate with a first interconnect line formed thereon. The first interconnect line is electrically connected to the second interconnect line via the conductive bump. The method includes a step of forming a first region of the interlayer insulating film on the substrate with the first interconnect line formed thereon, the first region including a part of a peripheral wall of the through hole; a step of forming a second region of the interlayer insulating film on the substrate with the first region formed thereon, the second region including a remaining part of the peripheral wall of the through hole; and a step of forming the conductive bump. This embodiment of the present invention can provide a method of manufacturing a multilevel interconnect structure capable of electrically interconnecting upper and lower interconnect lines via a small through hole.

According to an aspect of the present invention, it is possible to provide a method of manufacturing a multilevel interconnect structure capable of electrically interconnecting upper and lower interconnect lines via an interlayer insulating film having a small through hole; a multilevel interconnect structure in which upper and lower interconnect lines are electrically interconnected via an interlayer insulating film having a small through hole; a transistor device including the multilevel interconnect structure; and an image display including the transistor device.

BRIEF DESCRIPTION OF THE DRAWINGS

FIG. 1 is a cut-away side view showing an example of a multilevel interconnect structure according to an embodiment of the present invention;

FIGS. 8A-8C are diagrams illustrating a printing result in the case where the viscosity of a first insulating paste is higher than the viscosity of a second insulating paste;

DETAILED DESCRIPTION OF THE PREFERRED EMBODIMENT

Preferred embodiments of the present invention are described below with reference to accompanying drawings.

According to a method of manufacturing a multilevel interconnect structure of an embodiment of the present invention, a multilevel interconnect structure is manufactured using a screen printing method, in which an interlayer insulating film having a through hole with a conductive bump therein and a second interconnect line are stacked on a substrate with a first interconnect line formed thereon; and the first interconnect line is electrically connected to the second interconnect line via the conductive bump. More specifically, the method includes a step of forming a first region of the interlayer insulating film on the substrate with the first interconnect line formed thereon, the first region including a part of a peripheral wall of the through hole; a step of forming a second region of the interlayer insulating film on the substrate with the first region formed thereon, the second region including a remaining part of the peripheral wall of the through hole; and a step of forming the conductive bump. With this method, it is possible to manufacture a high-density multilevel interconnect structure in which upper and lower interconnect lines can be interconnected via a small through hole with less manufacturing steps using simple techniques.

FIG. 1 shows an example of a multilevel interconnect structure according to an embodiment of the present invention. In the multilevel interconnect structure shown in FIG. 1, an interlayer insulating film 3 having through holes is formed on a substrate 1 with a first interconnect line 2 formed thereon. Conductive bumps 4 are filled in the through holes. A second interconnect line 5 on the interlayer insulating film 3 is electrically connected to the first interconnect line 2 via the conductive bumps 4. The multilevel interconnect structure shown in FIG. 1 is manufactured by using a method of manufacturing a multilevel interconnect structure of an embodiment of the present invention.

Figure 2C:
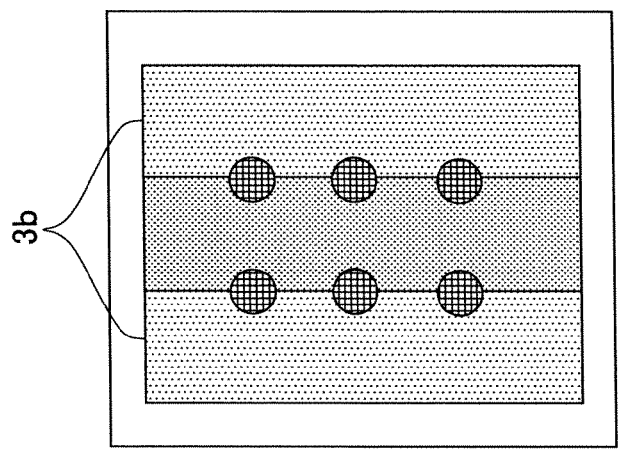
FIGS. 2A-2C are diagrams illustrating a method of manufacturing a multilevel interconnect structure according to an embodiment of the present invention.
Figure 2B:
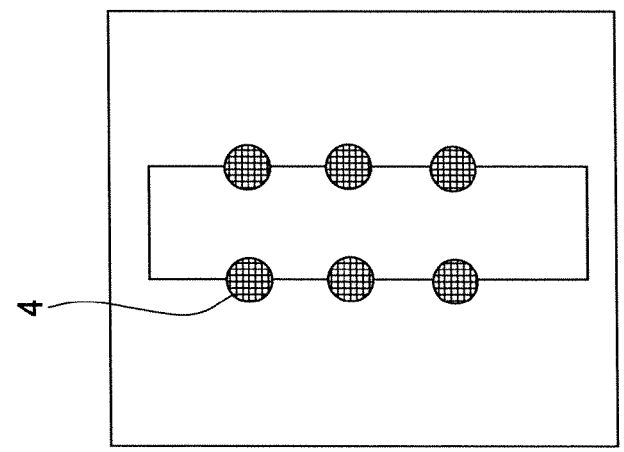
Figure 2A:
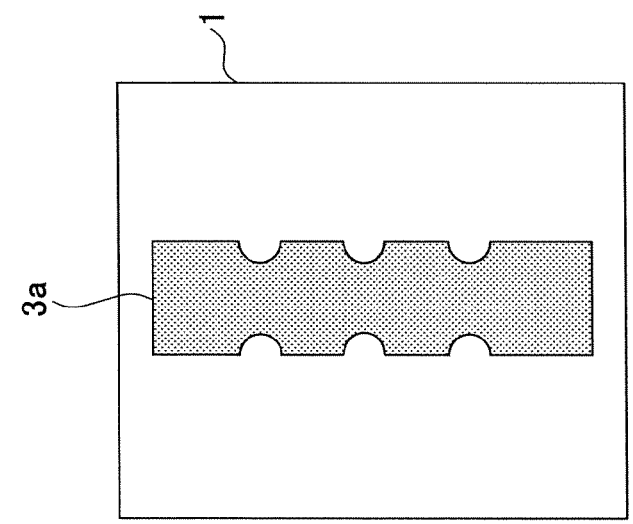

FIGS. 2A-2C are diagrams illustrating a method of manufacturing a multilevel interconnect structure according to an embodiment of the present invention. First, a first region 3a of an interlayer insulating film 3 is formed on a substrate 1, on which a first interconnect line (not shown) is formed, by using a screen printing method, so that a part of the interlayer insulating film 3 including a part of a peripheral wall of each through hole is formed (see FIG. 2A). The first region 3a is formed such that the through holes are formed on the first interconnect line (not shown). Next, conductive bumps 4 are formed aligned with the part of the peripheral walls of the through holes by using the screen printing method (see FIG. 2B). Then, a second region 3b of the interlayer insulating film 3 is formed aligned with the first region 3a and the conductive bumps 4 by using the screen printing method, so that the remaining part of the peripheral wall of each through hole is formed (see FIG. 2C). With these three steps, an interconnect structure is obtained wherein the conductive bumps 4 electrically connected to the first interconnect line protrude beyond the surface of the interlayer insulating film 3. Then, a second interconnect line 5 is formed so as to be electrically connected to the conductive bumps 4, so that a two-level interconnect structure is obtained.

In the above first three steps, the first region 3a and the second region 3b may be formed after forming the conductive bumps 4 on the first interconnect line 2. The order of the steps may be appropriately selected depending on the target size of the through holes and the shape of the first region 3a.

In an embodiment of the present invention, commercially available conductive pastes containing a conductive material may be used for forming the conductive bumps. Examples of conductive material include silver, copper, carbon, and aluminum. Among these, metal materials are preferable. Two or more types of conductive materials may be used in combination. The first interconnect line and the second interconnect line may be formed of one or more of the above conductive materials by using a known method.

A screen printing machine and a screen printing mask used by the screen printing method may be those known in the art. The screen printing machine needs to have configurable settings for clearance, angle of a squeegee, pressure and speed, and preferably has a substrate stage having operating accuracy of less than 10 μm. The screen printing mask can be appropriately selected based on the shape of a region to be printed in each step, viscosity of paste to be used, the proportion of solid, etc. Ejection of paste can be controlled by adjusting the wire diameter (thickness) of a mesh, the opening area ratio, and the thickness of emulsion, and it is thus possible to print a film having a desired thickness.

In an embodiment of the present invention, the interlayer insulating film preferably contains an organic material and particles. Examples of organic material include polyvinyl alcohol resin, polyvinyl acetal resin, acrylic resin, ethyl cellulose resin, polyethylene, polystyrene, and polyamide. These materials may be used in combination of two or more of them. The particles may be any of organic and inorganic particles so long as they can exist as particles in the interlayer insulating film. However, inorganic particles may be preferable because the size of the inorganic particles is easy to control and because the inorganic particles are dispersible in solvent. Examples of the material of the inorganic particles include silica ($SiO_2$), alumina ($Al_2O_3$), titanium oxide ($TiO_2$), zinc oxide (ZnO), and barium titanate ($BaTiO_3$). Among these, the materials having relatively low permittivity, such as silica, alumina, and zinc oxide, may be preferable. Porous particles having mesoporous or a microporous structure, such as mesoporous silica, may be used as well.

To form the interlayer insulating film, an insulating paste may be used that is prepared by mixing an organic material and particles into a solvent and optionally adding dispersant, plasticizer, and viscosity modifier. The mixture ratio between the organic material and the particles is not particularly limited and may be appropriately adjusted to make the paste have a suitable physical property in accordance with a pattern to be formed. To ensure flexibility of the interlayer insulating film, it is preferable to increase the proportion of the organic material. Specifically, the volume ratio of the organic material in the interlayer insulating film is preferably 40% or greater, and more preferably 50% or greater in order to make the interlayer insulating film applicable even to a flexible substrate. Although the insulating paste may be adjusted according to the shapes and areas of the first region and the second region of the interlayer insulating film, compositions of the dried first region and second region preferably do not greatly differ from each other.

Figure 3C:
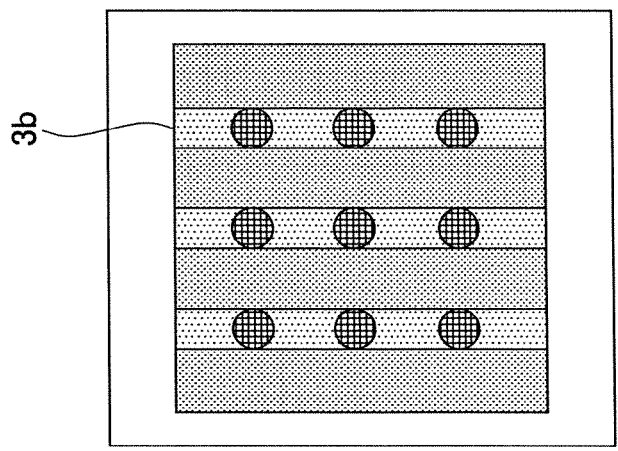
FIGS. 3A-3C are diagrams illustrating another method of manufacturing a multilevel interconnect structure according to an embodiment of the present invention.
Figure 3B:
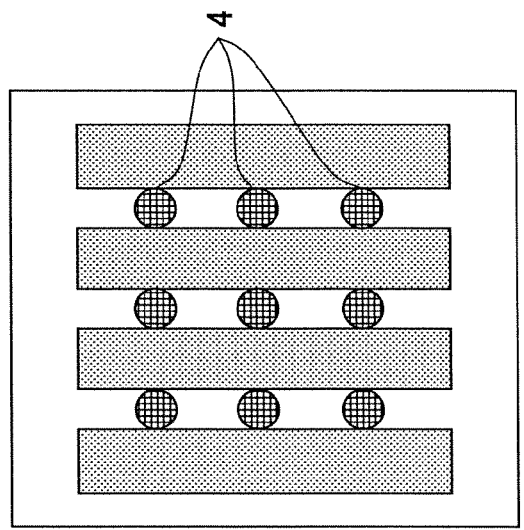
Figure 3A:
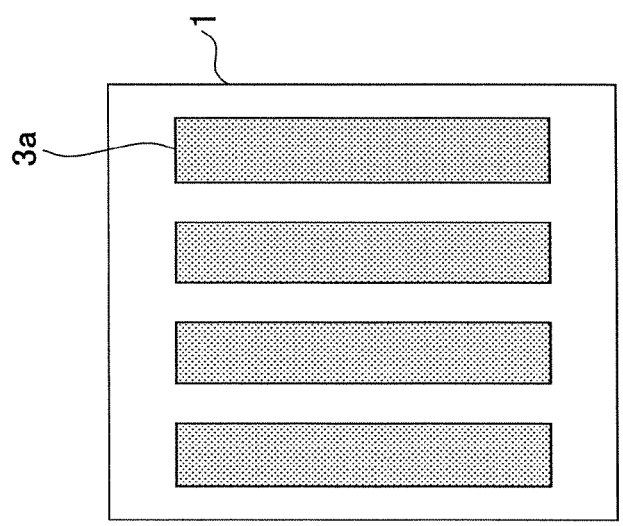

FIGS. 3A-3C are diagrams illustrating another method of manufacturing a multilevel interconnect structure according to an embodiment of the present invention. First, a first region 3a of an interlayer insulating film 3 is formed on a substrate 1, on which a first interconnect line (not shown) is formed, by using a screen printing method. The first region 3a is formed in substantially parallel lines (see FIG. 3A). The first region 3a is formed such that through holes are formed on the first interconnect line (not shown). Next, conductive bumps 4 are formed aligned with the first region 3a by using the screen printing method (see FIG. 3B). Then, a second region 3b of the interlayer insulating film 3 is formed aligned with the first region 3a and the conductive bumps 4 by using the screen printing method. The second region 3b is formed in a discontinuous pattern, extending in the area excluding the first region 3a (see FIG. 3C). With these three steps, an interconnect structure is obtained wherein the conductive bumps 4 electrically connected to the first interconnect line protrude beyond the surface of the interlayer insulating film 3. Then, a second interconnect line 5 is formed so as to be electrically connected to the conductive bumps 4, so that a two-level interconnect structure is obtained. The width and the interval of the line pattern of the first region 3a and the shape of the discontinuous pattern of the second region 3b can be appropriately determined according to the desired size of and the space between through holes. Since the line pattern and the discontinuous pattern are relatively easily formed by using the screen printing method, the allowable ranges of the physical property of the insulating pastes and printing conditions are increased, thereby realizing stable printing operations.

Figure 4A:
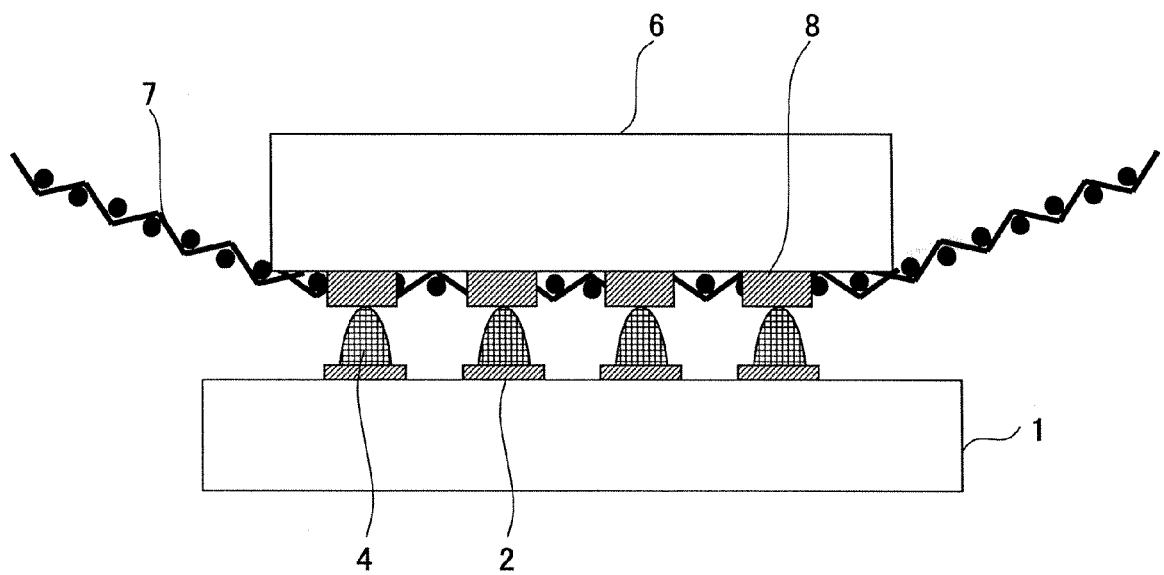
FIG. 4A is a diagram illustrating a printing method that forms a first region of an interlayer insulating film after forming conductive bumps.
Figure 4B:
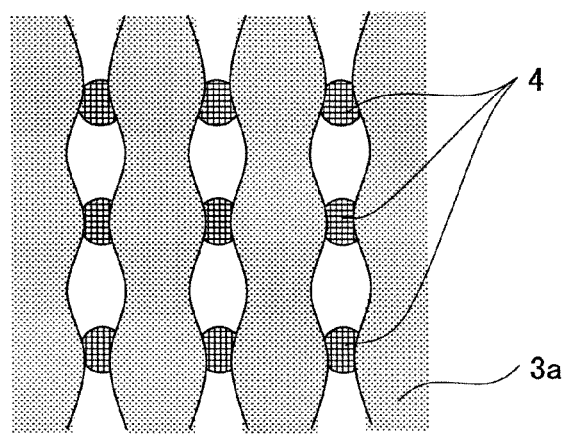
FIG. 4B is a diagram illustrating a result of printing using the printing method of FIG. 4A.
Figure 5:
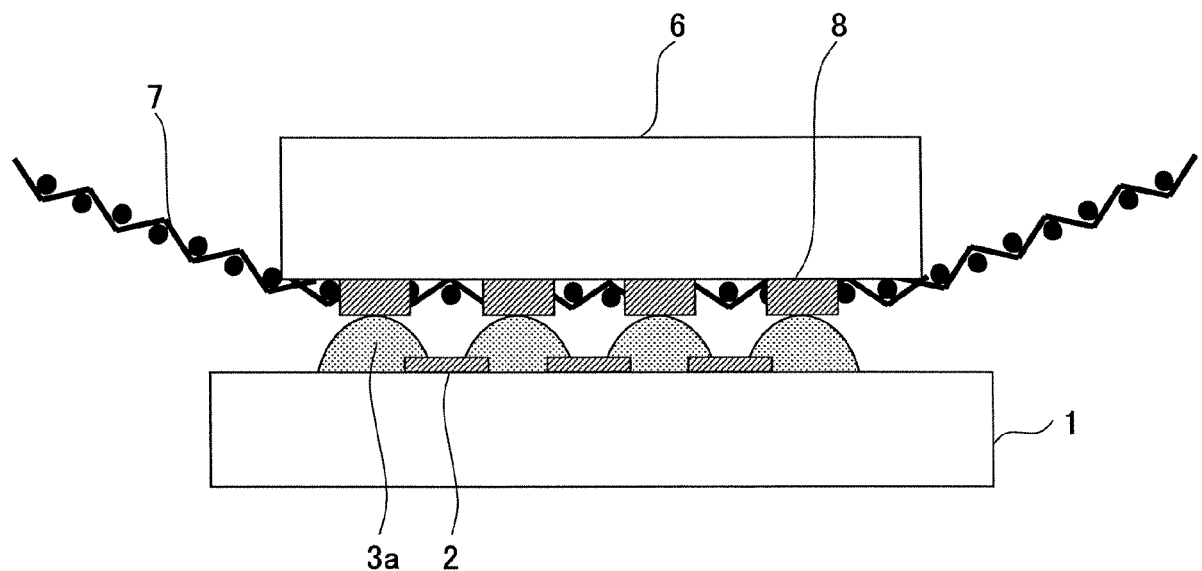
FIG. 5 is a diagram illustrating a printing method that forms conductive bumps after forming a first region of an interlayer insulating film.

According to an embodiment of the present invention, it is preferable to first form the first region 3a, then form the conductive bumps 4, and then form the second region 3b as shown in FIGS. 2A-2C and FIGS. 3A-3C. If, as shown in FIG. 4A, the conductive bumps 4 are formed before forming the first region 3a, the first region 3a is printed over the conductive bumps 4. That is, when ejecting the insulating paste through regions of a mesh 7 without emulsion 8 by sliding a squeegee 6, the mesh 7 is spaced apart from the substrate 1 by the height of the conductive bump 4, so that the ejection amount of the insulating paste is increased. As a result, as shown in FIG. 4B, the conductive bumps 4 are likely to be covered with the first region 3a of the interlayer insulating film 3. Moreover, pattern accuracy of the first region 3a might be reduced. Therefore, forming the first region 3a before forming the conductive bumps 4 can increase the accuracy of formation of the first region 3a. If, as shown in FIG. 5, the conductive bumps 4 are formed after forming the first region 3a, the ejection amount of the conductive paste is increased by the amount corresponding to the height of the first region 3a. This method is preferable because the conductive bumps 4 can be made to protrude beyond the surface of the interlayer insulating film 3. Furthermore, since the conductive bumps 4 are formed before forming the second region 3b, it is possible to prevent the through holes from being covered with the insulating paste to be printed for forming the second region 3b due to leveling of the insulating paste and therefore it is possible to form the conductive bumps 4 inside the through holes. Thus, the first interconnect line 2 can be electrically connected to the second interconnect line 5.

Figure 6A:
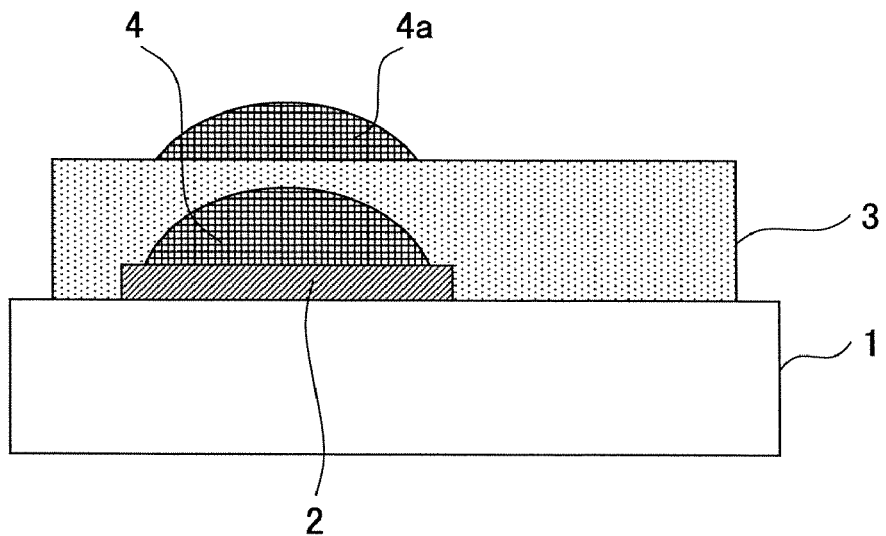
FIGS. 6A and 6B are cut-away side views illustrating a printing method that applies conductive paste over conductive bumps.

In an embodiment of the present invention, depending on conditions such as the height of the conductive bumps, the distance between the conductive bumps, and the thickness of the interlayer insulating film, it is sometimes difficult to prevent the top portions of the conductive bumps 4 from being partly or completely covered with the interlayer insulating film 3 (FIG. 4B) or the entire portions of conductive bumps 4 from being covered with the interlayer insulating film 3. If the interlayer insulating film 3 is disposed over the conductive bumps 4, it is difficult to electrically connect the conductive bumps 4 to the second interconnect line 5, which can result in interconnect failure. To prevent such a problem, as shown in FIG. 6A, a conductive paste 4a is applied over the conductive bumps 4 covered with the interlayer insulating film 3. Then, the conductive bumps 4 are electrically connected to the conductive material contained in the conductive paste 4a, so that the first interconnect line 2 can be electrically connected to the second interconnect line 5. As the process for electrically connecting the conductive bumps 4 to the conductive material of the conductive paste 4a, application of pressure or heat may be effective. To facilitate provision of the electrical connection, the interlayer insulating film 3 preferably contains the organic material that is soluble in a solvent contained in the conductive paste 4a. Then, the solvent contained in the conductive paste 4a dissolves the organic material contained in the interlayer insulating film 3, so that the conductive material contained in the conductive paste 4a penetrates through the interlayer insulating film 3 to come into contact with the conductive bumps 4. Thus the conductive bumps 4 can be electrically connected to the conductive material of the conductive paste 4a. The solvent is then dried, so that the conductive bumps 4 electrically connected to the first interconnect line 2 can be formed (see FIG. 6B). In the case of forming the conductive bumps 4 after forming the first region 3a as shown in FIGS. 2A-2C and FIGS. 3A-3C, the second region 3b contains the organic material that is soluble in the solvent contained in the conductive paste 4a.

Figure 7B:
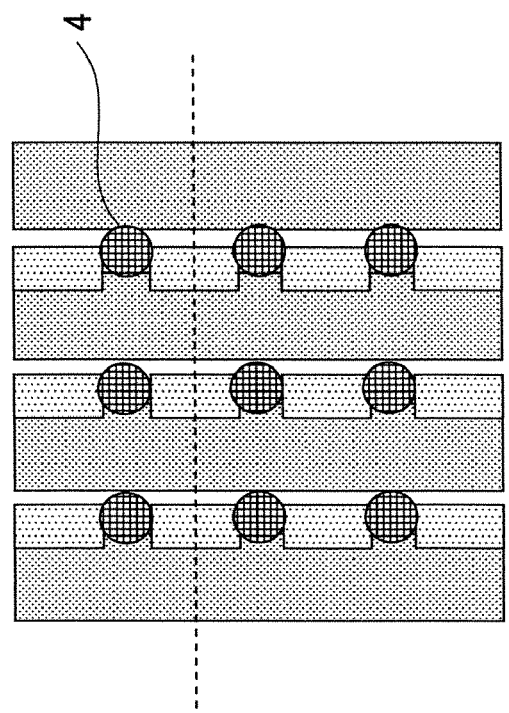
FIGS. 7A and 7B are diagrams illustrating a printing result in the case where a first region and a second region of an interlayer insulating film are not properly aligned.
Figure 7A:
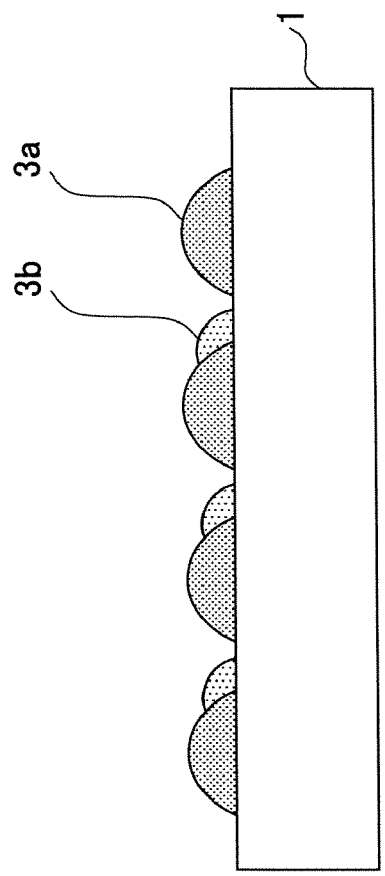

In an embodiment of the present invention, as shown in FIGS. 7A and 7B, in the case where the first region 3a is not properly aligned with the second region 3b, the substrate 1 might not be completely covered with either the first region 3a or the second region 3b. FIG. 7A is a top view, and FIG. 7B is a cross-sectional view taken along a broken line of FIG. 7A. To prevent such a defect, the viscosity of a first insulating paste to be used for forming the first region 3a is made higher than the viscosity of a second insulating paste to be used for forming the second region 3b. That is, since the first insulating paste having high viscosity and low fluidity is used for forming the first region 3a, the first region 3a can be formed into a desired pattern. Meanwhile, since the second insulating paste having low viscosity and high fluidity is used for forming the second region 3b, the printed second insulating paste is leveled before being dried, and it is therefore possible to prevent the defect from being made (see FIGS. 8A-8C). Thus the interlayer insulating film having high reliability can be formed. FIG. 8A is a top view, and FIGS. 8B and 8C are cross-sectional views taken along broken lines A and B, respectively, of FIG. 8A. The flow of the second insulating paste improves uniformity of the film thickness of the second region 3b, thereby reducing the difference with the level of the first region 3a. Although the viscosity of the insulating paste may be appropriately determined according to the size of the through holes to be formed or the distance between the through holes, the viscosity of the first insulating paste is generally 100 Pa·s or greater, and preferably 150 Pa·s. The viscosity of the second insulating paste is generally 100 Pa·s or less, and preferably 50 Pa·s or less.

In an embodiment of the present invention, the specific surface area of the particles contained in the first region of the interlayer insulating film is preferably greater than the specific surface area of the particles contained in the second region. Although the interlayer insulating film is formed separately as the first region and the second region, the first region and the second region ideally have the same composition from the standpoint of affinity between the first region and the second region and the uniformity of the entire interlayer insulating film. As mentioned above, it is preferable to use the first insulating paste having high viscosity (low fluidity) and the second insulating paste having low viscosity (high fluidity). The easiest method to adjust the viscosity of a paste without changing the composition of solid content is to adjust the content of the solvent. However, if the content of the solvent in the paste is changed for adjusting the viscosity, the content of solid in the paste is changed. That is, if the content of the solvent is increased to lower the viscosity of the second insulating paste, the content of the solid is reduced, so that the film thickness of the dried second region is reduced. As a result, the film thickness of the second region becomes less than that of the first region. Thus the thickness uniformity of the interlayer insulating film is lowered, which might adversely affect the second interconnect line. This problem can be solved by using particles having different specific surface areas. Specific surface area is the total surface area of particles per unit weight. The property of increasing viscosity of a particle is proportional to its specific surface area. The greater the specific surface area (i.e. the smaller the particle size), the greater the property of increasing viscosity. Therefore, the first insulating paste is made to contain particles with greater specific area to have higher viscosity, while the second insulating paste is made to contain particles with smaller specific area to have lower viscosity. It is thus possible to prepare insulating pastes having different viscosities without changing the contents and compositions of solids, so that uniformity of the composition and the thickness of the interlayer insulating film can be improved.

In an embodiment of the present invention, as shown in FIGS. 8A-8C, the interlayer insulating film is preferably formed such that at least a part of the second region is formed on the first region. As mentioned above, in the case where the first region is not properly aligned with the second region, the substrate might not be completely covered with either the first region or the second region. If the second insulating paste having fluidity is used, the second region fills the gap with the first region and is partly disposed on the first region, so that it is possible to form a highly reliable interlayer insulating film while preventing the above described defects.

Figure 9:
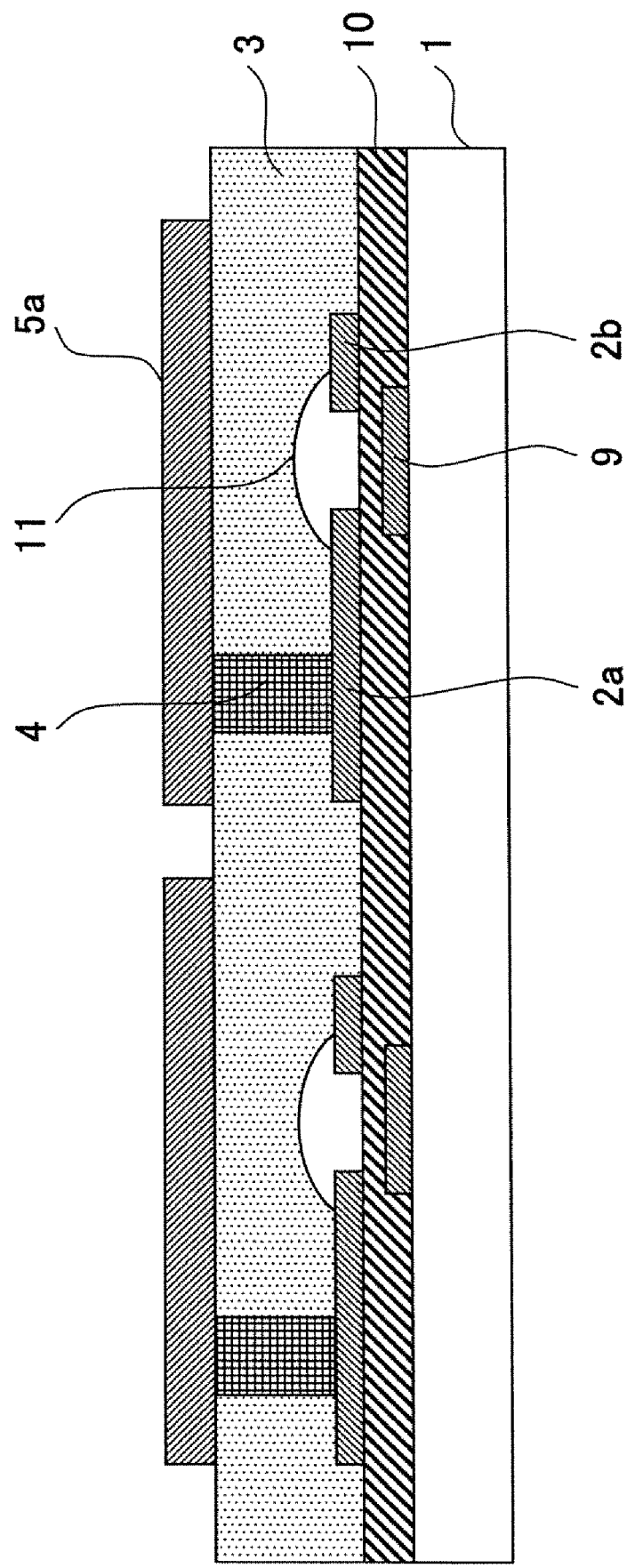
FIG. 9 is a cut-away side view showing an example of a transistor device according to an embodiment of the present invention.
Figure 10A:
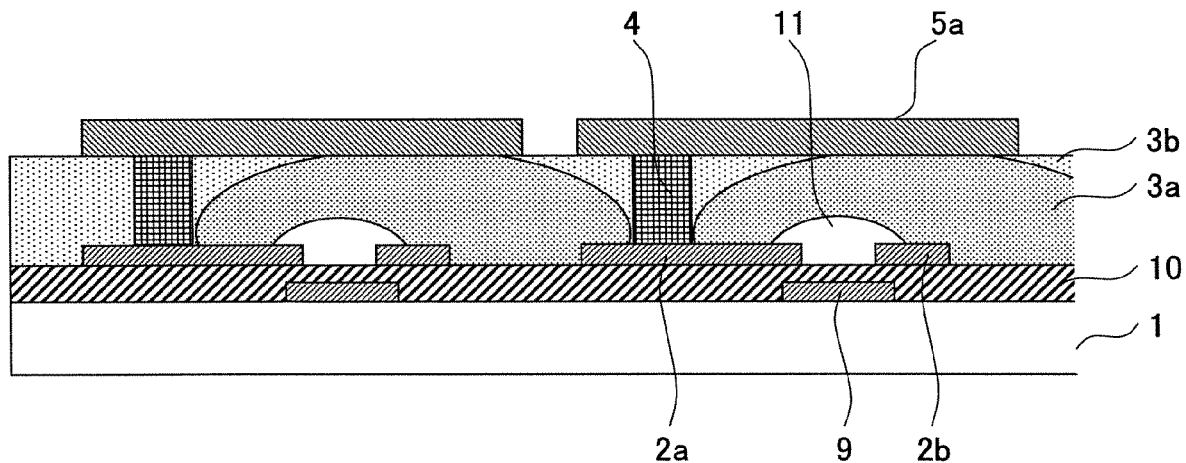
FIGS. 10A and 10B are diagrams illustrating another example of a transistor device according to an embodiment of the present invention.
Figure 10B:
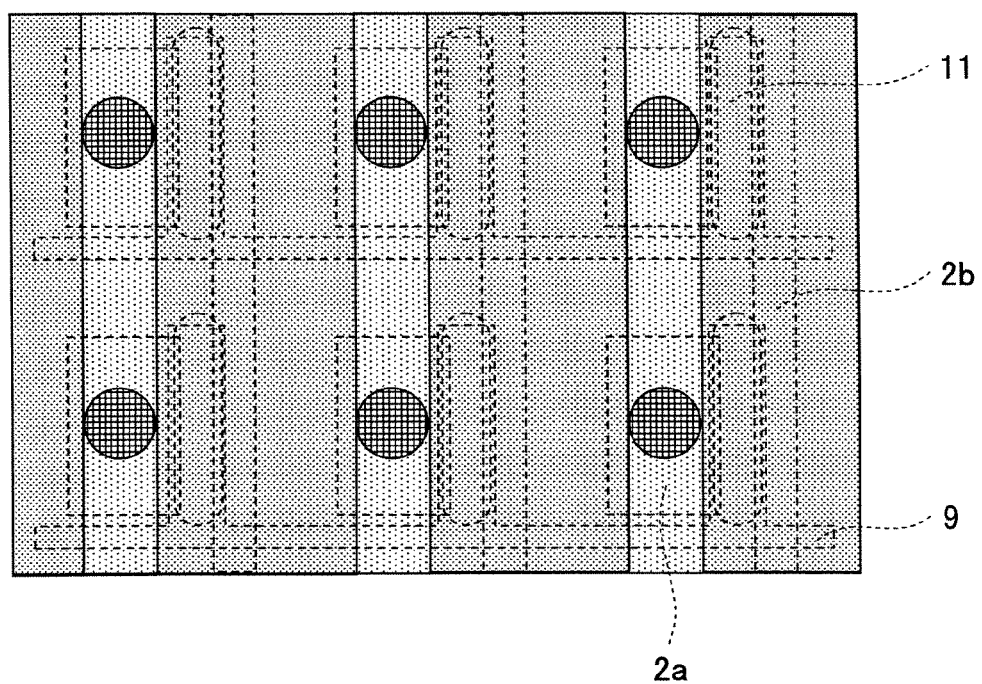

FIG. 9 illustrates an example of a transistor device according to an embodiment of the present invention. In the transistor device shown in FIG. 9, gate electrodes 9 and a gate insulating film 10 are formed on a substrate 1. Source electrodes 2a, drain electrodes 2b, and an organic semiconductor layer 11 are formed on the gate insulating film 10. Further, an interlayer insulating film 3 having through holes is formed to cover the source electrodes 2a, the drain electrodes 2b, and the organic semiconductor layer 11. Conductive bumps 4 are disposed in the through holes. Upper electrodes 5a are formed on the interlayer insulating film 3 having the through holes with the conductive bumps 4 inside. The source electrodes 2a as a first interconnect line are electrically connected to the upper electrodes 5a as a second interconnect line via the conductive bumps 4. The transistor device shown in FIG. 9 is manufactured by using a method of manufacturing a multi-level interconnect structure of an embodiment of the present invention. FIGS. 10A and 10B are diagrams illustrating another example of a transistor device according to an embodiment of the present invention. FIG. 10A is a cut-away side view and FIG. 10B is a top view. In FIGS. 10A and 10B, elements identical to those shown in FIG. 9 bear the same reference numerals and are not further described herein. In the transistor device shown in FIGS. 10A and 10B, a first region 3a of an interlayer insulating film 3 is disposed to cover an organic semiconductor layer 11 as a channel formation portion. Protecting the organic semiconductor layer 11 with the first region 3a in this manner can minimize variation of transistor properties due to oxygen and vapor in the atmosphere. This also prevents a mesh from coming into contact with the organic semiconductor layer 11 when screen-printing the conductive bumps 4 and the second region 3b, thereby reducing the physical load. Further, in the case where the process of dissolving the organic material contained in a second region 3b into a solvent contained in second conductive paste is employed (see FIGS. 6A and 6B), it is possible to prevent the organic semiconductor layer 11 from being damaged by the solvent.

Figure 11:
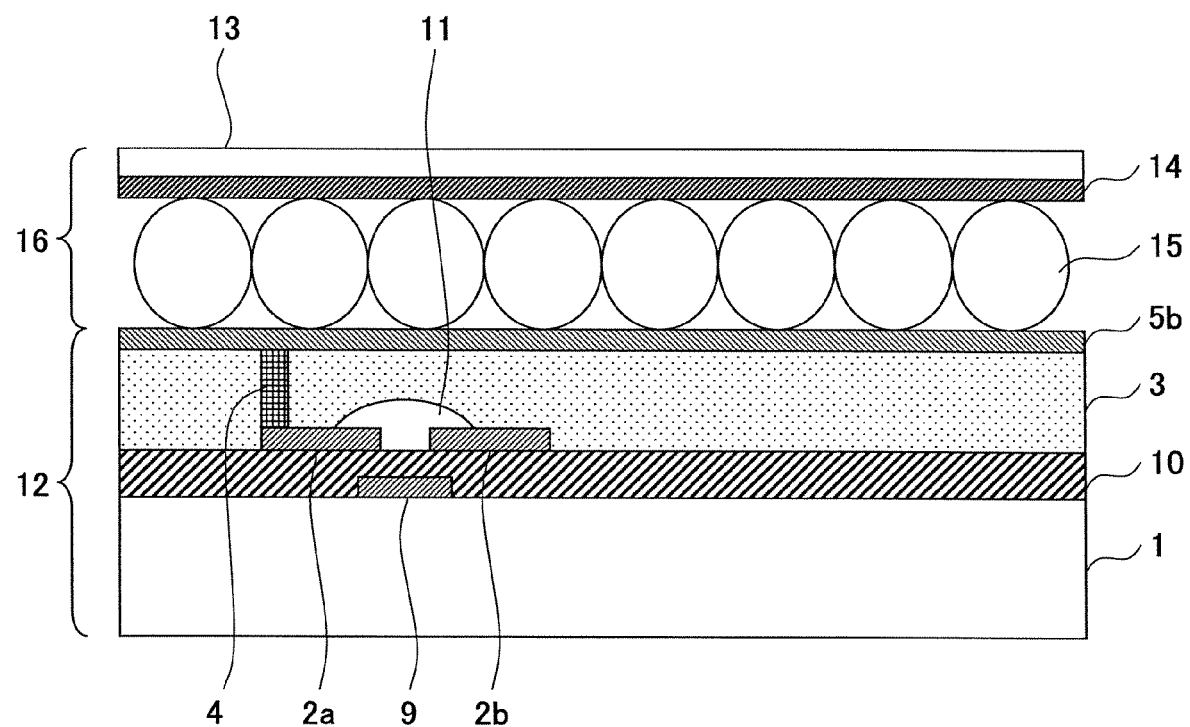
FIG. 11 is a cut-away side view showing an example of an image display according to an embodiment of the present invention.

FIG. 11 illustrates an example of an image display according to an embodiment of the present invention. In the image display shown in FIG. 11, a gate electrode 9 and a gate insulating film 10 are formed on a substrate 1. A source electrode 2a, a drain electrode 2b, and an organic semiconductor layer 11 are formed on the gate insulating film 10. Further, an interlayer insulating film 3 having a through hole is formed to cover the source electrode 2a, the drain electrode 2b, and the organic semiconductor layer 11. A conductive bump 4 is disposed in the through hole. A pixel electrode 5b is formed on the interlayer insulating film 3 having the through hole with the conductive bump 4 inside. The source electrode 2a as a first interconnect line is electrically connected to the pixel electrode 5b as a second interconnect line via the conductive bump 4. An electrophoretic display device 16 in which a transparent electrode 14 and microcapsules 15 are formed on a support substrate 13 is attached to an active matrix substrate having such a configuration. The image display shown in FIG. 11 is manufactured by using a method of manufacturing a multilevel interconnect structure of an embodiment of the present invention.

The image display device that can be used in this embodiment is not limited to the electrophoretic display device, but includes a liquid crystal display device, an organic EL device, and the like. Use of one of these devices can provide a flat panel image display that puts less strain on viewer's eyes or a flexible image display.

EXAMPLES

Example 1

A pattern of a first region 3a and a second region 3b of an interlayer insulating film 3 to be printed by using a screen printing mask have an ejection section of 160 μm width lines and a non-ejection section of 80 μm width lines. The screen printing mask used was a stainless mesh No. 500 of a 19 μm wire diameter, on which emulsion was deposited to a 15 μm thickness. A pattern of conductive bumps 4 to be printed by using a screen printing mask has an ejection section of 50 μm diameter circles spaced apart (arranged in a matrix form) at 240 μm pitches. The screen printing mask used was a stainless mesh No. 400 of a 23 μm wire diameter, on which emulsion was deposited to a 30 μm thickness.

Insulating paste used was prepared by dissolving polyvinyl alcohol resin into a mixed solvent of ethylene glycol monobutyl ether and α-terpineol and then adding an alumina filler of a 50 m$^2$/g specific surface area to adjust viscosity to about 150 Pa·s. Conductive paste used was thermosetting paste containing silver as the conductive material.

Referring to FIG. 1, the pattern of the first region 3a was aligned so as not to overlap contact portions of a second interconnect line 5 (to be formed later) and then screen-printed by using insulating paste onto a glass substrate 1 with a first interconnect line 2 formed thereon. The product was dried in an oven at 100° C. for 30 minutes, thereby obtaining the first region 3a. The first region 3a actually obtained was lines having widths about 180-190 μm arranged at 240 μm pitch.

Then, the pattern of the conductive bumps 4 was aligned so as to overlap the contact portions of the second interconnect line 5 (to be formed later) and then screen-printed by using the conductive paste. The product was dried in an oven at 120° C. for 1 hour, thereby obtaining the conductive bumps 4. The conductive bumps 4 actually obtained were in circular shapes having diameters of 55-60 μm and were partly disposed on the adjacent opposing lines of the first region 3a.

The pattern of the second region 3b was aligned in the direction orthogonal to the lines of the first region 3a so as not to overlap the first region 3a and the conductive bumps 4 and then screen-printed by using insulating paste. The product was dried in an oven at 100° C. for 30 minutes, thereby obtaining the second region 3b. The obtained second region 3b filled spaces between the first region 3a and the conductive bumps 4 and was partly disposed on the first region 3a and the conductive bumps 4. It was observed under optical microscope that all the conductive bumps 4 protrude beyond the surface of the interlayer insulating film 3.

Finally, the second interconnect line 5 was formed so as to overlap the conductive bumps 4, thereby obtaining a multi-level interconnect structure.

Then, contact chains of the first interconnect line 2 and the second interconnect line 5 were evaluated. From the evaluation of 10 positions in 200 contact chains it was found that the average resistance per through hole was 8Ω in all the positions, achieving appropriate contact resistance.

Example 2

Figures 12A, 12B:
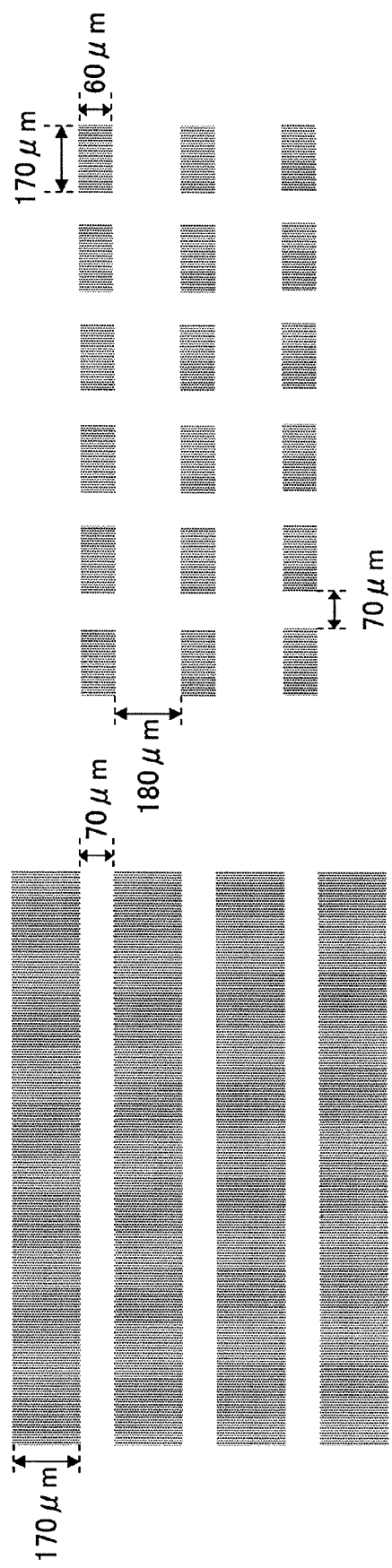
FIGS. 12A and 12B are diagrams showing patterns of an interlayer insulating film to be printed by using screen printing masks in Example 2.

FIGS. 12A and 12B show patterns of an interlayer insulating film 3 to be printed by using screen printing masks. Specifically, FIGS. 12A and 12B show patterns of a first region 3a and a second region 3b, respectively. The pattern shown in FIG. 12A has an ejection section of 170 μm width lines and a non-ejection section of 70 μm width lines. The screen printing mask used was a stainless mesh No. 500 of a 19 μm wire diameter, on which emulsion was deposited to a 15 μm thickness. The pattern shown in FIG. 12B has an ejection section of rectangles of 60 μm in length and 170 μm in width spaced apart (arranged in a matrix form) at 240 μm pitches. The screen printing mask used was a stainless mesh No. 500 applied metal plating treatment of a 19 μm wire diameter, on which emulsion was deposited to a 15 μm thickness. A pattern of conductive bumps 4 to be printed by using a screen printing mask has an ejection section of 50 μm diameter circles spaced apart (arranged in a matrix form) at 240 μm pitches. The screen printing mask used was a stainless mesh No. 400 of a 23 μm wire diameter, on which emulsion was deposited to a 30 μm thickness.

Insulating pastes used were the following: insulating paste A prepared by dissolving polyvinyl butyral resin into ethylene glycol monohexyl ether and then adding a silica filler of an 80 m$^2$/g specific surface area to adjust viscosity to about 250 Pa·s; and insulating paste B prepared by dissolving polyvinyl butyral resin into ethylene glycol monohexyl ether and then adding a silica filler of a 30 m$^2$/g specific surface area to adjust viscosity to about 80 Pa·s. The insulating pastes A and B were adjusted to have the same compositional weight ratio. Conductive paste used was the same as that used in Example 1.

Referring to FIG. 1, the pattern shown in FIG. 12A was aligned so as not to overlap contact portions of a second interconnect line 5 (to be formed later) and then screen-printed by using the insulating paste A onto a glass substrate 1 with a first interconnect line 2 formed thereon. The product was dried in an oven at 100° C. for 30 minutes, thereby obtaining the first region 3a. The first region 3a actually obtained was lines having widths about 185-195 μm arranged at 240 μm pitches.

Then, the pattern of the conductive bumps 4 was aligned so as to overlap the contact portions of the second interconnect line 5 (to be formed later) and then screen-printed by using the conductive paste. The product was dried in an oven at 120° C. for 1 hour, thereby obtaining the conductive bumps 4. The conductive bumps 4 actually obtained were in circular shapes having diameters of 55-60 μm and were partly disposed on the adjacent opposing lines of the first region 3a.

The pattern shown in FIG. 12B was aligned so as not to overlap the first region 3a and the conductive bumps 4 and then screen-printed by using the insulating paste B. The product was dried in an oven at 100° C. for 30 minutes, thereby obtaining the second region 3b. The obtained second region 3b filled spaces between the first region 3a and the conductive bumps 4 and was partly disposed on the first region 3a and the conductive bumps 4. It was observed under optical microscope that all the conductive bumps 4 protrude beyond the surface of the interlayer insulating film 3.

Finally, the second interconnect line 5 was formed so as to overlap the conductive bumps 4, thereby obtaining a multi-level interconnect structure.

Then, contact chains of the first interconnect line 2 and the second interconnect line 5 were evaluated. From the evaluation of 10 positions in 200 contact chains it was found that the average resistance per through hole was 12Ω in all the positions, achieving appropriate contact resistance.

Example 3

A screen printing mask for an interlayer insulating film 3, a screen printing mask for conductive bumps 4, insulating pastes, and conductive paste used were the same as those used in Example 2.

A pattern of the conductive bumps 4 was aligned so as to overlap contact portions of a second interconnect line 5 (to be formed later) and then screen-printed by using the conductive paste onto a glass substrate 1 with a first interconnect line 2. The product was dried in an oven at 120° C. for 1 hour, thereby obtaining the conductive bumps 4. The conductive bumps 4 actually obtained were in circular shapes having diameters of 55-60 μm.

The pattern shown in FIG. 12A was aligned so as not to overlap the conductive bumps 4 and then screen-printed by using the insulating paste A. The product was dried in an oven at 100° C. for 30 minutes, thereby obtaining the first region 3a. The first region 3a actually obtained was lines having widths about 185-195 μm arranged at 240 μm pitches and was partly disposed on the conductive bumps 4.

The pattern shown in FIG. 12B was aligned so as not to overlap the first region 3a and the conductive bumps 4 and then screen-printed by using the insulating paste B. The product was dried in an oven at 100° C. for 30 minutes, thereby obtaining the second region 3b. The obtained second region 3b filled spaces between the first region 3a and the conductive bumps 4 and was partly disposed on the first region 3a and the conductive bumps 4. It was observed under optical microscope that all the conductive bumps 4 are partly covered with the interlayer insulating film 3.

Finally, the second interconnect line 5 was formed so as to overlap the conductive bumps 4, thereby obtaining a multilevel interconnect structure.

Then, contact chains of the first interconnect line 2 and the second interconnect line 5 were evaluated. From the evaluation of 10 positions in 200 contact chains, it was found that the average resistance per through hole was 20Ω or less in 4 out of 10 positions, achieving appropriate contact resistance. However, in the remaining 6 positions, the contact resistance was high, and one or more through holes not interconnecting the first interconnect line 2 and the second interconnect line 5 were present.

Example 4

Figure 6B:
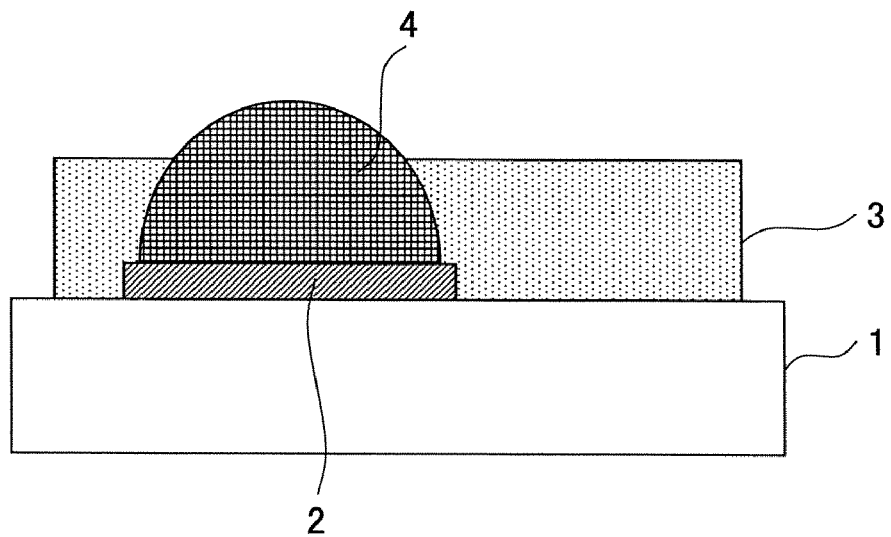

Referring to FIGS. 6A and 6B, in the same manner as in Example 2, a first region 3a, conductive bumps 4, and a second region 3b were formed on a glass substrate 1 with a first interconnect line 2 formed thereon. Then, in the same manner as the conductive bumps 4, the pattern of conductive bumps 4a was aligned so as to overlap the conductive bumps 4, screen-printed by using conductive paste, and then dried, thereby obtaining the conductive bumps 4a. The conductive paste used was the same as that used in Example 1 except in containing ethylene glycol monohexyl ether which is the same as that contained in the insulating paste. The conductive bumps 4 actually obtained were in circular shapes having diameters of 55-60 μm. It was observed under optical microscope that all the conductive bumps 4 protrude beyond the surface of the interlayer insulating film 3.

Finally, referring to FIG. 1, the second interconnect line 5 was formed so as to overlap the conductive bumps 4, thereby obtaining a multilevel interconnect structure.

Then, contact chains of the first interconnect line 2 and the second interconnect line 5 were evaluated. From the evaluation of 10 positions in 200 contact chains it was found that the average resistance per through hole is 7Ω in all the positions, achieving appropriate contact resistance. The result of the evaluation showed that the resistance was reduced compared with Example 2. That is, applying the conductive paste 4a enhances the connection between the first interconnect line 2 and the second interconnect line 5.

Example 5

Figures 13A, 13B:
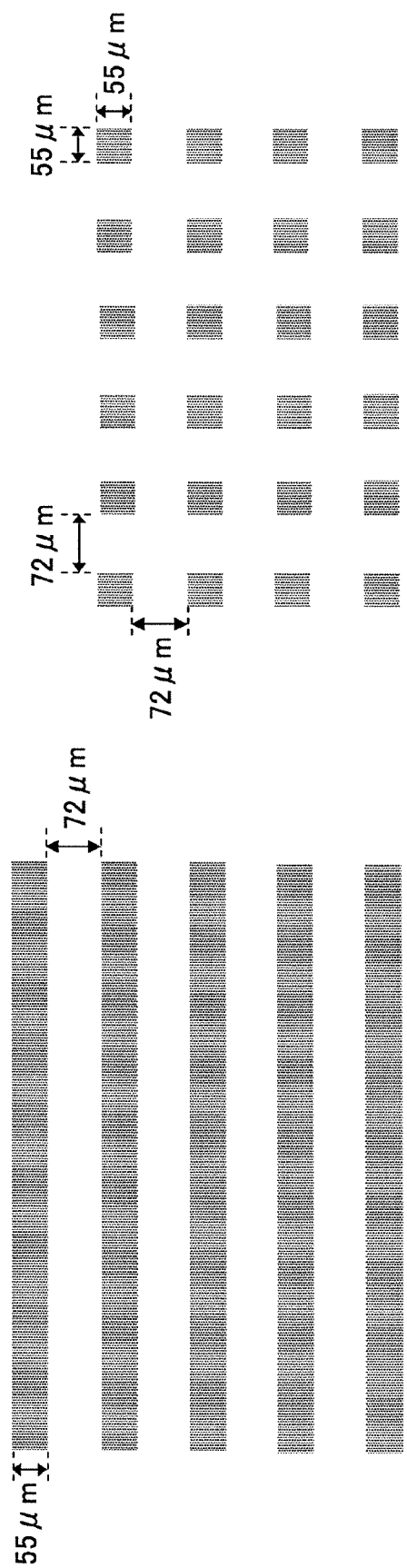
FIGS. 13A and 13B are diagrams showing patterns of an interlayer insulating film printed by using screen printing masks in Example 5.

FIGS. 13A and 13B show patterns of an interlayer insulating film 3 printed by using screen printing masks. Specifically, FIGS. 13A and 13B show patterns of a first region 3a and a second region 3b, respectively. The pattern shown in FIG. 13A has an ejection section of 55 μm width lines and a non-ejection section of 72 μm width lines. The screen printing mask used was a stainless mesh No. 500 of a 19 μm wire diameter, on which emulsion was deposited to a 15 μm thickness. The pattern shown in FIG. 13B has an ejection section of squares of 55 μm by 55 μm spaced apart (arranged in a matrix form) at 127 μm pitches. The screen printing mask used was a stainless mesh No. 500 applied metal plating treatment of a 19 μm wire diameter, on which emulsion was deposited to a 15 μm thickness. A pattern of conductive bumps 4 to be printed by using a screen printing mask has an ejection section of 50 μm diameter circles spaced apart (arranged in a matrix form) at 127 μm pitches. The screen printing mask used was a stainless mesh No. 400 of a 23 μm wire diameter, on which emulsion was deposited to a 30 μm thickness.

Insulating pastes used were the following: insulating paste C prepared by dissolving polyvinyl butyral resin of a polymerization degree of about 400 into ethylene glycol monohexyl ether and then adding a silica filler of a 80 m²/g specific surface area and a barium titanate filler of a 20 m²/g to adjust viscosity to about 160 Pa·s; and insulating paste D prepared by dissolving polyvinyl butyral resin of a polymerization degree of about 400 into ethylene glycol monohexyl ether and then adding a silica filler of a 30 m²/g specific surface area and a barium titanate filler of a 20 m²/g to adjust viscosity to about 80 Pa·s. The insulating pastes C and D were adjusted to have the same compositional weight ratio. Conductive paste used was the same as that used in Example 1.

Referring to FIG. 1, the pattern shown in FIG. 13A was aligned so as not to overlap contact portions of a second interconnect line 5 (to be formed later) and then screen-printed by using the insulating paste C onto a polycarbonate substrate 1 with a first interconnect line 2 formed thereon. The product was dried in an oven at 100° C. for 30 minutes, thereby obtaining the first region 3a. The first region 3a actually obtained was lines having widths about 80 μm arranged at 127 μm pitches.

Then, the pattern of the conductive bumps 4 was aligned so as to overlap contact portions of the second interconnect line 5 (to be formed later) and then screen-printed onto the first interconnect line 2 by using the conductive paste. The product was dried in an oven at 120° C. for 1 hour, thereby obtaining the conductive bumps 4. The conductive bumps 4 actually obtained were in circular shapes having diameters of 55-60 μm and were partly on the adjacent opposing lines of the first region 3a.

The pattern shown in FIG. 13B was aligned so as not to overlap the first region 3a and the conductive bumps 4 and then screen-printed by using the insulating paste D. The product was dried in an oven at 100° C. for 30 minutes, thereby obtaining the second region 3b. The obtained second region 3b filled spaces between the first region 3a and the conductive bumps 4 and was partly disposed on the first region 3a and the conductive bumps 4. It was observed under optical microscope that all the conductive bumps 4 protrude beyond the surface of the interlayer insulating film 3.

Finally, the second interconnect line 5 was formed so as to overlap the conductive bumps 4, thereby obtaining a multilevel interconnect structure.

Then, contact chains of the first interconnect line 2 and the second interconnect line 5 were evaluated. From the evaluation of 10 positions in 200 contact chains it was found that the average resistance per through hole is 6Ω in all the positions, achieving appropriate contact resistance.

Example 6

As shown in FIGS. 10A and 10B, nano-silver ink was pattern-printed onto a polycarbonate substrate 1 by an ink-jet method and dried, thereby obtaining gate electrodes 9. Then, thermal polymeric polyimide was applied by spin coating, and heated at 190° C., thereby obtaining a gate insulating film 10. The obtained gate insulating film 10 had a specific permittivity of 3.6 and a film thickness of 0.4 μm. Subsequently, ultraviolet rays were irradiated through a photomask for surface modification onto regions where source electrodes 2a and drain electrodes 2b are to be formed. Then, nano-silver ink was pattern-printed by an ink-jet method and then dried, thereby obtaining the source electrodes 2a and the drain electrodes 2b. Subsequently, an ink was pattern-printed by an ink-jet method and dried, thereby obtaining an organic semiconductor layer 11. Thus the organic transistors were obtained. The ink used was prepared by dissolving an organic semiconductor material represented by a structure formula shown below into xylene.

Then, 20 parts by weight of titanium oxide, 1 part by weight of acid polymer, 2 parts by weight of silicone polymer graft carbon black MX3-GRX-001 (manufactured by Nippon Shokubai Co., Ltd.), and 77 parts by weight of silicone oil KF96L-1cs (manufactured by Shin-Etsu Chemical Co., Ltd.) were mixed and dispersed by ultrasonic waves for 1 hour to obtain a dispersion liquid of black and white particles. Microcapsules of the dispersion liquid of black and white particles were formed by a complex coacervation method using gelatin and Arabic gum. The average particle diameter of the microcapsules was about 60 μm. The microcapsules were dispersed in a urethane resin solvent to obtain a dispersion liquid. The dispersion liquid was spread onto a film substrate with a

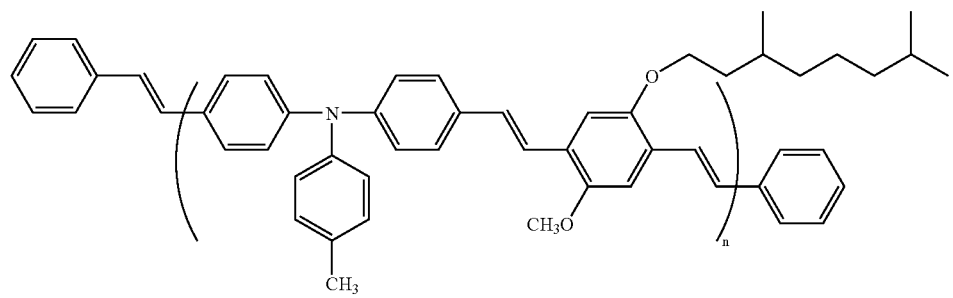

The obtained organic transistors had channel lengths of 10 μm and channel widths of 200 μm.

Screen printing masks for the interlayer insulating film 3 and the conductive bumps 4 used were the same as those used in Example 2. Insulating pastes used were the following: insulating paste E prepared by dissolving polyvinyl butyral resin into ethylene glycol monohexyl ether and then adding a silica filler of a 80 m²/g specific surface area and a barium titanate filler of a 20 m²/g to adjust viscosity to about 250 Pa·s; and insulating paste F prepared by dissolving polyvinyl butyral resin into a solvent and then adding a silica filler of a 30 m²/g specific surface area and a barium titanate filler of a 20 m²/g to adjust viscosity to about 100 Pa·s. The insulating pastes E and F were adjusted to have the same compositional weight ratio. Conductive paste used was the same as that used in Example 1.

The pattern shown in FIG. 12A was aligned so as not to overlap contact portions of upper electrodes 5 (to be formed later) and then screen-printed by using the insulating paste E onto the organic transistors. The product was dried in a vacuum oven at 100° C. under a reduced pressure, thereby obtaining the first region 3a. Then, the pattern of the conductive bumps 4 was aligned so as to overlap the contact portions of the upper electrodes 5a (to be formed later) and then screen-printed onto the source electrodes 2a by using the conductive paste. The product was dried at 120° C., thereby obtaining the conductive bumps 4. The pattern shown in FIG. 12B was aligned so as not to overlap the first region 3a and the conductive bumps 4 and then screen-printed by using the insulating paste F. The product was dried at 100° C., thereby obtaining the second region 3b. Finally, the pattern of the upper electrodes 5a was screen-printed so as to overlap the conductive bump 4 by using a silver paste made of silver particles, acrylic resin and a solvent, and then dried, thereby obtaining the upper electrodes 5a communicating with the organic transistors. Thus an active matrix substrate was obtained in which transistor devices are arranged in a lattice form.

transparent electrode film formed thereon by a wire blade method, thereby forming a uniform microcapsule sheet. Thus an electrophoretic display device was obtained.

The obtained electrophoretic display device was attached to the active matrix substrate, thereby obtaining an image display as shown in FIG. 11. It was confirmed that the obtained image display was capable of displaying images in monochrome substantially at a resolution of 200 ppi.

Example 7

As shown in FIGS. 10A and 10B, nano-silver ink was pattern-printed onto a glass substrate 1 by an ink-jet method and dried, thereby obtaining gate electrodes 9. Then, thermal polymeric polyimide was applied by spin coating, and heated at 280° C., thereby obtaining a gate insulating film 10. The obtained gate insulating film 10 had a specific permittivity of 3.6 and a film thickness of 0.4 μm. Subsequently, ultraviolet rays were irradiated through a photomask for surface modification onto regions where source electrodes 2a and drain electrodes 2b are to be formed. Then, nano-silver ink was pattern-printed by an ink-jet method and then dried, thereby obtaining the source electrodes 2a and the drain electrodes 2b. Subsequently, an ink was pattern-printed by an ink-jet method and dried, thereby obtaining an organic semiconductor layer 11. Thus the organic transistors were obtained. The ink used was prepared by dissolving the same organic semiconductor material as used in Example 6 into xylene. The obtained organic transistors had channel lengths of 10 μm and channel widths of 70 μm.

Screen printing masks for the interlayer insulating film 3 and the conductive bumps 4, insulating pastes, and conductive paste used were the same as those used in Example 6.

As shown in FIGS. 10A and 10B, the pattern shown in FIG. 13A was aligned so as not to overlap contact portions of upper electrodes 5 (to be formed later) and then screen-printed by using the insulating paste C onto the organic transistors. The product was dried in a vacuum oven at 100° C. under a reduced pressure, thereby obtaining the first region 3a. Then, the pattern of the conductive bumps 4 was aligned so as to overlap contact portions of the upper electrodes 5a (to be formed later) and then screen-printed onto the source electrodes 2a by using the conductive paste. The product was dried at 120° C., thereby obtaining the conductive bumps 4. The pattern shown in FIG. 13B was aligned so as not to overlap the first region 3a and the conductive bumps 4 and then screen-printed by using the insulating paste D. The product was dried at 100° C., thereby obtaining the second region 3b. Finally, the pattern of the upper electrodes 5a was screen-printed so as to overlap the conductive bump 4 by using a silver paste made of silver particles, acrylic resin and a solvent, and then dried, thereby obtaining the upper electrodes 5a possible to connect to the organic transistors. Thus an active matrix substrate was obtained in which transistor devices are arranged in a lattice form.

Then, 20 parts by weight of titanium oxide, 1 part by weight of acid polymer, 2 parts by weight of silicone polymer graft carbon black MX3-GRX-001 (manufactured by Nippon Shokubai Co., Ltd.), and 77 parts by weight of silicone oil KF96L-1cs (manufactured by Shin-Etsu Chemical Co., Ltd.) were mixed and dispersed by ultrasonic waves for 1 hour to obtain a dispersion liquid of black and white particles. Microcapsules of the dispersion liquid of black and white particles were formed by a complex coacervation method using gelatin and Arabic gum. The average particle diameter of the microcapsules was about 60 µm. The microcapsules were dispersed in a urethane resin solvent to obtain a dispersion liquid. The dispersion liquid was spread onto a film substrate with a transparent electrode film formed thereon by a wire blade method, thereby forming a uniform microcapsule sheet. Thus an electrophoretic display device was obtained.

The obtained electrophoretic display device was attached to the active matrix substrate, thereby obtaining an image display as shown in FIG. 11. It was confirmed that the obtained image display was capable displaying images in monochrome substantially at a resolution of 200 ppi.

The present application is based on Japanese Priority Application No. 2006-311758 filed on Nov. 17, 2006, and Japanese Priority Application No. 2007-139678 filed on May 25, 2007, with the Japanese Patent Office, the entire contents of which are hereby incorporated by reference.

What is claimed is:

1. A method of manufacturing a multilevel interconnect structure using a screen printing method, in which an interlayer insulating film having a through hole with a conductive bump therein and a second interconnect line are stacked on a substrate with a first interconnect line formed thereon; and the first interconnect line is electrically connected to the second interconnect line via the conductive bump, the method comprising:
    forming a first region of the interlayer insulating film on the substrate with the first interconnect line formed thereon, the first region including a part of a peripheral wall of the through hole;
    forming a second region of the interlayer insulating film on the substrate with the first region formed thereon, the second region including a remaining part of the peripheral wall of the through hole; and
    forming the conductive bump,
    wherein the through hole has a diameter of 55-60 µm.

2. The method of manufacturing the multilevel interconnect structure as claimed in claim 1, wherein the interlayer insulating film contains an organic material and particles.

3. The method of manufacturing a multilevel interconnect structure as claimed in claim 1, further comprising:
    applying a conductive paste over the conductive bump after forming the first region, the second region, and the conductive bump on the substrate with the first interconnect line formed thereon.

4. The method of manufacturing a multilevel interconnect structure as claimed in claim 1, further comprising:
    forming the conductive bump on the first interconnect line on the substrate with the first region formed thereon; and
    forming the second region on the substrate with the conductive bump formed thereon.

5. The method as claimed in claim 1, wherein a first insulating paste used to form the first region has a viscosity higher than a viscosity of a second insulating paste used to form the second region.

6. The method as claimed in claim 5, wherein the viscosity of the first insulting paste is higher than 100 Pa·s and the viscosity of the second insulating paste is lower than 100 Pa·s.

* * * * *